(12) United States Patent
Nakajima et al.

(10) Patent No.: US 9,755,654 B2
(45) Date of Patent: Sep. 5, 2017

(54) ATOMIC CELL, QUANTUM INTERFERENCE DEVICE, ATOMIC OSCILLATOR, ELECTRONIC DEVICE AND MOVING OBJECT

(71) Applicant: Seiko Epson Corporation, Tokyo (JP)

(72) Inventors: Takuya Nakajima, Kofu (JP); Yoshiyuki Maki, Suwa (JP)

(73) Assignee: Seiko Epson Corporation (JP)

( * ) Notice: Subject to any disclaimer, the term of this patent is extended or adjusted under 35 U.S.C. 154(b) by 6 days.

(21) Appl. No.: 14/662,584

(22) Filed: Mar. 19, 2015

(65) Prior Publication Data

US 2015/0270843 A1 Sep. 24, 2015

(30) Foreign Application Priority Data

Mar. 20, 2014 (JP) ................. 2014-059250

(51) Int. Cl.
  *H01S 1/06* (2006.01)
  *H03B 17/00* (2006.01)
  *H03L 7/26* (2006.01)
  *G04F 5/14* (2006.01)

(52) U.S. Cl.
  CPC ............ *H03L 7/26* (2013.01); *G04F 5/14* (2013.01); *G04F 5/145* (2013.01); *H01S 1/06* (2013.01)

(58) Field of Classification Search
  CPC ... H03L 7/26; G04F 5/14; G04F 5/145; H01S 1/06

USPC ...................................................... 331/94.1, 3
See application file for complete search history.

(56) References Cited

U.S. PATENT DOCUMENTS

| 8,258,884 | B2 * | 9/2012 | Borwick, III | G04F 5/145 |
| | | | | 331/3 |
| 2010/0101649 | A1 * | 4/2010 | Huignard | B32B 17/10036 |
| | | | | 136/261 |
| 2012/0206135 | A1 * | 8/2012 | Nagasaka | G01R 33/26 |
| | | | | 324/244.1 |
| 2013/0015920 | A1 | 1/2013 | Sato et al. | |
| 2013/0194046 | A1 * | 8/2013 | Schober | G01C 19/66 |
| | | | | 331/94.1 |
| 2014/0139294 | A1 * | 5/2014 | Harasaka | H03L 7/26 |
| | | | | 331/1 R |
| 2014/0306700 | A1 * | 10/2014 | Kamada | G01R 33/26 |
| | | | | 324/244.1 |

FOREIGN PATENT DOCUMENTS

| JP | 2000-012951 A | 1/2000 |
| JP | 2010-205875 A | 9/2010 |
| JP | 2013-038382 A | 2/2013 |

* cited by examiner

*Primary Examiner* — Richard Tan
(74) *Attorney, Agent, or Firm* — Harness, Dickey & Pierce, P.L.C.

(57) ABSTRACT

A gas cell includes alkali metal enclosed within an internal space configured by a trunk portion and window portions. An interior wall surface of the trunk portion includes a holding portion having a contact angle with liquid alkali metal of less than 90°.

21 Claims, 11 Drawing Sheets

ATOMIC CELL, QUANTUM INTERFERENCE DEVICE, ATOMIC OSCILLATOR, ELECTRONIC DEVICE AND MOVING OBJECT

BACKGROUND

1. Technical Field

The present invention relates to an atomic cell, a quantum interference device, an atomic oscillator, an electronic device, and a moving object.

2. Related Art

An atomic oscillator that oscillates based on energy transition of alkali metal atoms such as rubidium or cesium is known to maintain highly accurate oscillation characteristics for a long period of time.

Generally, an operation principle of the atomic oscillator is broadly classified into a technique of using a double resonance phenomenon caused by light and microwaves and a technique of using coherent population trapping (CPT) caused by two lights different wavelengths.

In an atomic oscillator using either one of the techniques, an alkali metal is generally enclosed in a gas cell (an atomic cell), and the gas cell is heated to a predetermined temperature by a heater so that the alkali metal is maintained in a certain gas state.

Here, generally, all of the alkali metal in the gas cell is not turned into gas, but rather a portion of the alkali metal becomes excess liquid. The excess alkali metal atoms become liquid by precipitation (condensation) in a portion of the gas cell having a low temperature. But, if the liquid alkali metal atoms exist in a portion through which excitation light passes, the liquid alkali metal atoms block the excitation light, and this causes a decrease of the oscillation characteristics of the atomic oscillator.

Therefore, in a gas cell disclosed in JP-A-2010-205875, a concave portion for precipitating alkali metal is provided on an interior wall surface of the gas cell.

However, in the gas cell disclosed in JP-A-2010-205875, the excess alkali metal precipitated in the concave portion is positioned relatively close to an area through which excitation light passes, and this state changes over time due to thermal diffusion and the like. Therefore, a portion of the excited gaseous alkali metal comes into contact with the excess alkali metal in the concave portion and a state of the excited gaseous alkali metal becomes uneven. As a result, the oscillation characteristics decrease (for example, a frequency change occurs).

SUMMARY

An advantage of some aspects of the invention is to provide an atomic cell that can suppress a decrease of the characteristics caused by excess metal atoms and to provide a quantum interference device, an atomic oscillator, an electronic device and a moving object including the atomic cell.

The invention can be implemented as the following forms or application examples.

Application Example 1

An atomic cell according to this application example of the invention includes metal; and a wall portion that configures an internal space in which the metal is enclosed. An interior wall surface of the wall portion includes a metal retaining portion having a contact angle with liquid metal of less than 90°.

According to the atomic cell, since the wettability of the metal retaining portion with respect to the liquid metal is high, excess liquid metal is spread out along the metal retaining portion so that the excess liquid metal can be stably maintained in the metal retaining portion. Therefore, the movement or the shake of the liquid metal can be decreased (that is, the movement of the liquid metal in the atomic cell can be stabilized), and as a result, the decrease of the characteristics caused by the excess metal can be suppressed.

Application Example 2

In the atomic cell according to the application example of the invention, it is preferable that the contact angle of the liquid metal with the metal retaining portion is less than 70°.

With this configuration, the wettability of the metal retaining portion with respect to the liquid metal can be enhanced.

Application Example 3

In the atomic cell according to the application example of the invention, it is preferable that the contact angle of the liquid metal with the metal retaining portion is less than 60°.

With this configuration, the wettability of the metal retaining portion with respect to the liquid metal can be enhanced.

Application Example 4

In the atomic cell according to the application example of the invention, a portion of the metal may become liquid in the internal space.

When the liquid metal exists in the internal space as an excess, and the liquid metal is moved or shaken, then the characteristics decrease. However, with the configuration described above, the effect of the invention is remarkably achieved.

Application Example 5

In the atomic cell according to the application example of the invention, it is preferable that the internal space includes a metal reservoir portion in which the liquid metal is arranged (retained), and the metal retaining portion is arranged on an interior wall surface of the metal reservoir portion.

With this configuration, the liquid metal can be maintained in a portion of the atomic cell in which the influence on the characteristics of the atomic cell is small.

Application Example 6

In the atomic cell according to the application example of the invention, it is preferable that a surface roughness Ra of the metal retaining portion is in a range of 10 nm to 980 nm.

With this configuration, with a relatively simple configuration, excess liquid metal is spread out along the metal retaining portion so that the excess liquid metal can be stably maintained in the metal retaining portion.

Application Example 7

In the atomic cell according to the application example of the invention, it is preferable that the metal retaining portion includes a porous membrane.

With this configuration, with a relatively simple configuration, excess liquid metal is spread out along the metal retaining portion so that the excess liquid metal can be stably maintained in the metal retaining portion.

Application Example 8

In the atomic cell according to the application example of the invention, it is preferable that an interior wall surface of the metal reservoir portion is roughened by etching.

With this configuration, with a relatively simple configuration, excess liquid metal is spread out along the metal retaining portion so that the excess liquid metal can be stably maintained in the metal retaining portion.

Application Example 9

In the atomic cell according to the application example of the invention, it is preferable that the wall portion is configured with a material including at least one of silicon and glass.

With this configuration, while the basic functions desired of the atomic cell are secured, the metal retaining portion can be relatively easily formed by etching or deposition.

Application Example 10

In the atomic cell according to the application example of the invention, it is preferable that the wall portion includes a pair of window portions, and the surfaces on the internal space sides of the respective window portions include regions having greater contact angles with the liquid metal than that of the metal retaining portion.

With this configuration, the attachment of the liquid metal to the window portions can be decreased.

Application Example 11

A quantum interference device according to this application example of the invention includes the atomic cell according to the application example of the invention.

With this configuration, it is possible to provide a quantum interference device including an atomic cell that can suppress the decrease of the characteristics caused by excess metal atoms.

Application Example 12

An atomic oscillator according to this application example of the invention includes the atomic cell according to the application example of the invention.

With this configuration, it is possible to provide an atomic oscillator including an atomic cell that can suppress the decrease of the characteristics caused by excess metal atoms.

Application Example 13

An electronic device according to this application example of the invention includes the atomic cell according to the application example of the invention.

With this configuration, it is possible to provide an electronic device including an atomic cell that can suppress the decrease of the characteristics caused by excess metal atoms.

Application Example 14

A moving object according to this application example of the invention includes the atomic cell according to the application example of the invention.

With this configuration, it is possible to provide a moving object including an atomic cell that can suppress the decrease of the characteristics caused by excess metal atoms.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

Hereinafter, an atomic cell, a quantum interference device, an atomic oscillator, an electronic device, and a moving object according to the invention are described in detail based on embodiments illustrated in the accompanying drawings.

1. Atomic Oscillator (Quantum Interference Device)

First, an atomic oscillator according to the invention (an atomic oscillator including a quantum interference device according to the invention) is described. Also, hereinafter, an example in which a quantum interference device according to the invention is applied to an atomic oscillator is described, but the quantum interference device according to the invention is not limited hereto. For example, in addition to the atomic oscillator, the quantum interference device may be applied to a magnetic sensor, a quantum memory, and the like.

First Embodiment

Figure 1:
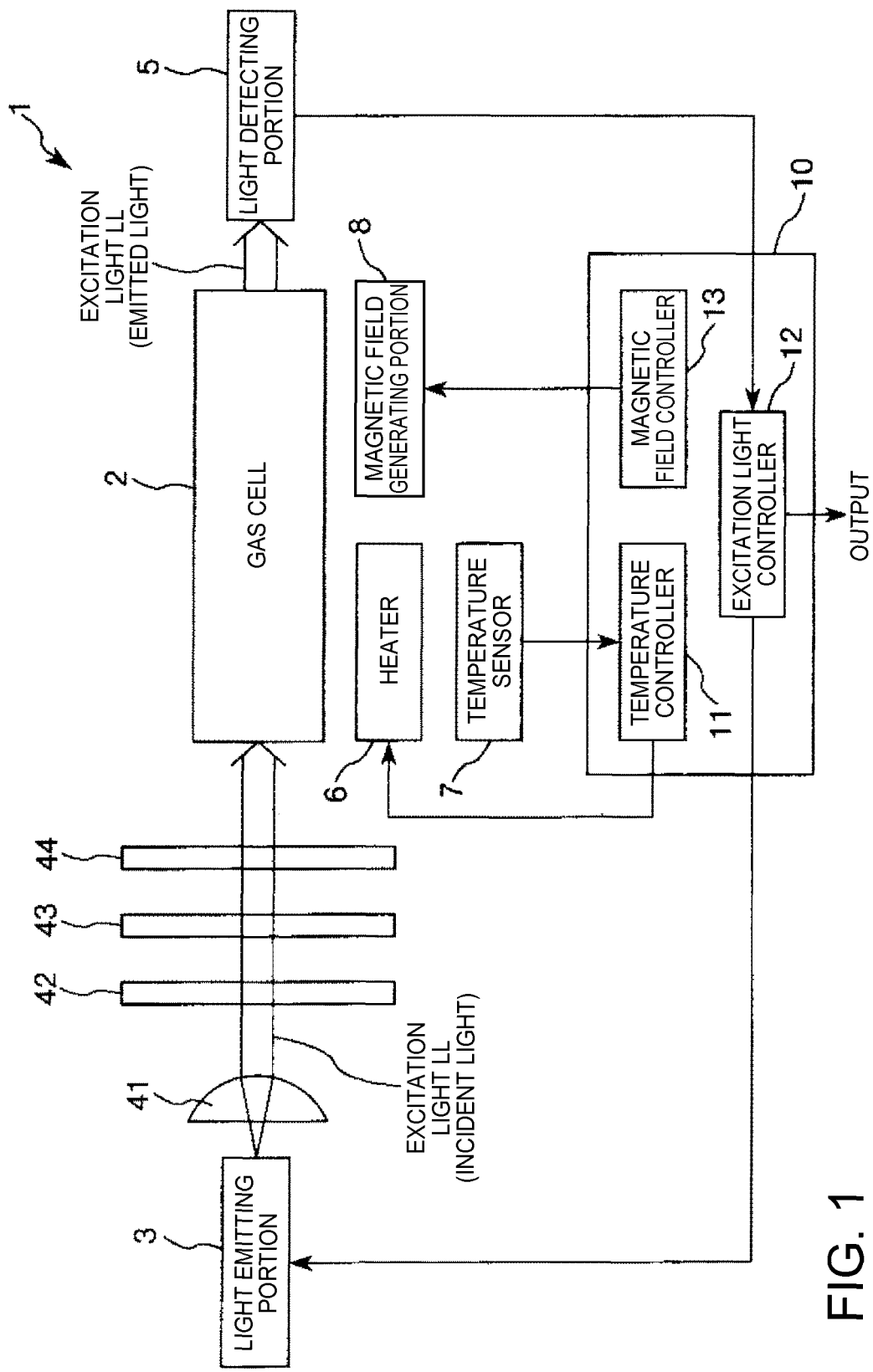
FIG. 1 is a diagram schematically illustrating an atomic oscillator (quantum interference device) according to a first embodiment of the invention.
Figure 2:
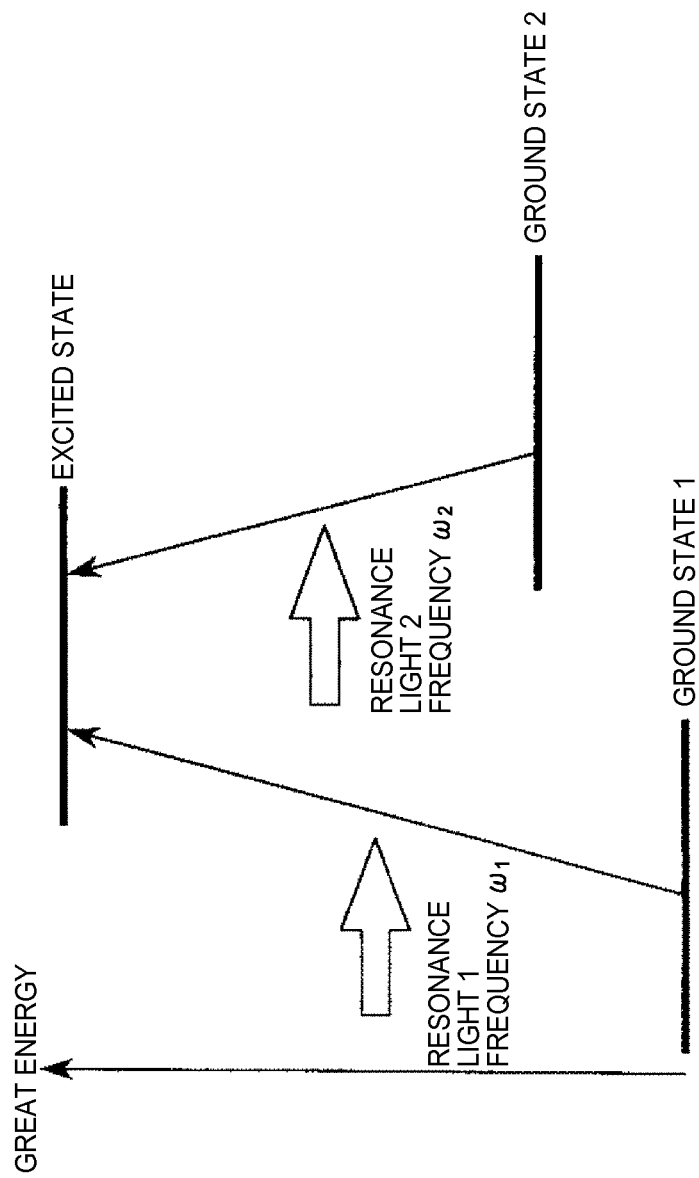
FIG. 2 is a diagram illustrating an energy state of alkali metal.
Figure 3:
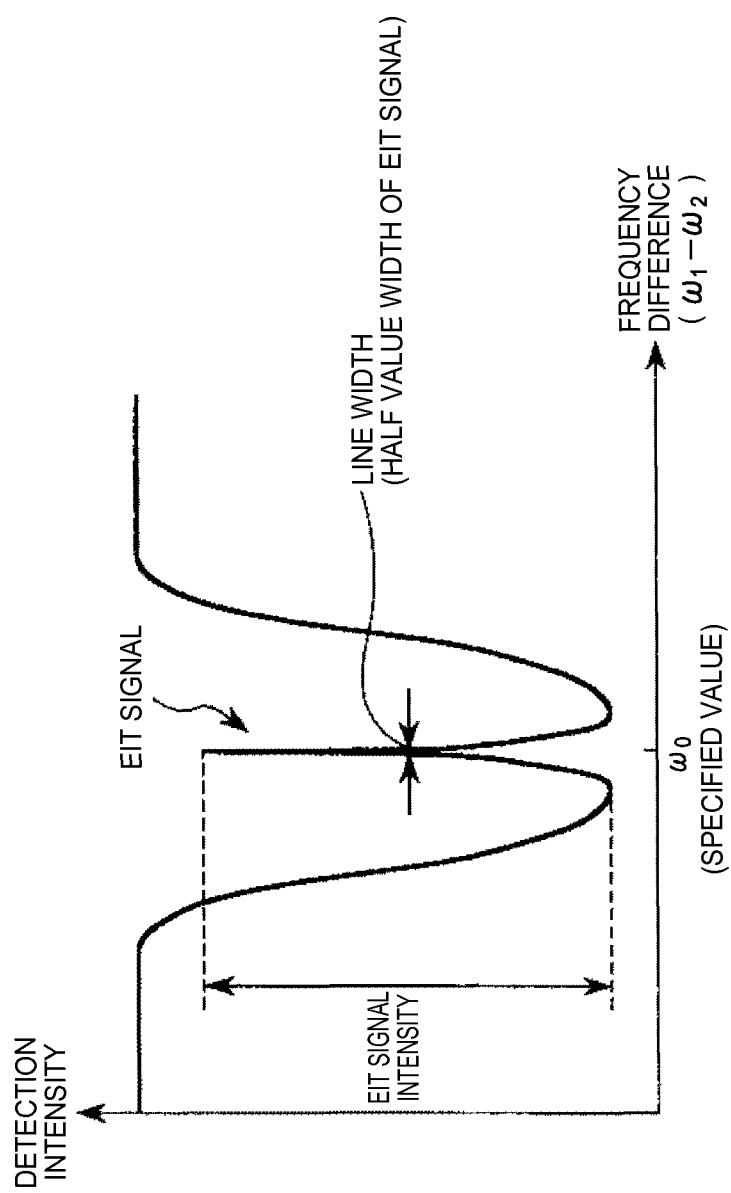
FIG. 3 is a graph illustrating a relationship between a frequency difference of two light beams emitted from a light emitting portion and an intensity of light detected by a light detecting portion.

FIG. 1 is a diagram schematically illustrating an atomic oscillator (quantum interference device) according to the first embodiment of the invention. In addition, FIG. 2 is a diagram illustrating an energy state of alkali metal, and FIG. 3 is a graph illustrating a relationship between a frequency difference of two light beams emitted from a light emitting portion and an intensity of light detected by a light detecting portion.

An atomic oscillator 1 illustrated in FIG. 1 is an atomic oscillator that uses coherent population trapping. As illustrated in FIG. 1, the atomic oscillator 1 includes a gas cell 2 (atomic cell), a light emitting portion 3, optical components 41, 42, 43, and 44, a light detecting portion 5, a heater 6, a temperature sensor 7, a magnetic field generating portion 8, and a controller 10.

First, a principle of the atomic oscillator 1 is briefly described.

As illustrated in FIG. 1, in the atomic oscillator 1, the light emitting portion 3 emits excitation light LL toward the gas cell 2, and the light detecting portion 5 detects the excitation light LL that penetrates the gas cell 2.

Gaseous alkali metal (metal atoms) is enclosed in the gas cell 2. As illustrated in FIG. 2, the alkali metal has energy levels in a three-level system, and can be in three states: two ground state having different energy levels (ground states 1 and 2) and an excited state. Here, the ground state 1 has an energy state lower than the ground state 2.

The excitation light LL emitted from the light emitting portion 3 includes two resonance lights 1 and 2 which have difference frequencies. When gaseous alkali metal is irradiated with the two resonance lights 1 and 2, light absorption rates (light transmittances) of the resonance lights 1 and 2 in the alkali metal change according to a difference ($\omega_1-\omega_2$) between a frequency $\omega_1$ of the resonance light 1 and a frequency $\omega_2$ of the resonance light 2.

Also, when the difference ($\omega_1-\omega_2$) between the frequency $\omega_1$ of the resonance light 1 and the frequency $\omega_2$ of the resonance light 2 is identical to a frequency corresponding to the energy difference between the ground state 1 and the ground state 2, excitation from the ground states 1 and 2 to the excited state stops respectively. At this point, neither of the resonance lights 1 or 2 is absorbed in the alkali metal but penetrates through the alkali metal. The phenomenon is called a CPT phenomenon or electromagnetically induced transparency (EIT).

For example, if the light emitting portion 3 causes the frequency $\omega_1$ of the resonance light 1 to be fixed and causes the frequency $\omega_2$ of the resonance light 2 to be changed, when the difference ($\omega_1-\omega_2$) between the frequency $\omega_1$ of the resonance light 1 and the frequency $\omega_2$ of the resonance light 2 is identical to a frequency $\omega_0$ corresponding to an energy difference between the ground state 1 and the ground state 2, the detection intensity of the light detecting portion 5 steeply increases as illustrated in FIG. 3. The steep signal is detected as an EIT signal. The EIT signal is an eigenvalue determined according to the kind of alkali metal. Accordingly, an oscillator can be configured by using the EIT signal.

Hereinafter, respective portions of the atomic oscillator 1 are specifically described in order.

Gas Cell

Alkali metal such as gaseous rubidium, cesium, and sodium is enclosed in the gas cell 2. In addition, a noble gas such as argon and neon, an inert gas such as nitrogen, and the like can be enclosed in the gas cell 2 as a buffer gas together with alkali metal gas, if desired.

As described below, the gas cell 2 includes a trunk portion having through holes, a pair of window portions that block the through holes of the trunk portion form an internal space that encloses the gaseous alkali metal and any liquid or solid alkali metal which is an excess. That is, an interior surface of the trunk portion adjacent the through hole defines the internal space.

Light Emitting Portion

The light emitting portion 3 (light source) has a function of emitting the excitation light LL that excites alkali metal atoms in the gas cell 2.

Specifically, the light emitting portion 3 emits two lights (the resonance light 1 and the resonance light 2) having different frequencies as described above, as the excitation light LL. The resonance light 1 can excite (resonate) the alkali metal in the gas cell 2 to change the ground state 1 to the excited state. The resonance light 2 can excite (resonate) the alkali metal in the gas cell 2 to change the ground state 2 to the excited state.

The light emitting portion 3 is not particularly limited, as long as it can emit excitation light as described above. However, for example, a semiconductor laser such as a vertical cavity surface emitting laser (VCSEL) may be used.

In addition, the temperature of the light emitting portion 3 is adjusted to a predetermined temperature by a temperature adjusting element (heat resistor, Peltier device, or the like) (not illustrated).

Optical Component

The plurality of optical components 41, 42, 43, and 44 are provided in the optical path of the excitation light LL between the light emitting portion 3 and the gas cell 2 described above. Here, the optical components 41, 42, 43, and 44 are provided from the light emitting portion 3 side to the the gas cell 2 side in the sequence of the optical component 41, the optical component 42, the optical component 43, and the optical component 44.

The optical component 41 is a lens. Accordingly, the excitation light LL can be applied to the gas cell 2 without being wasted.

In addition, the optical component 41 has a function of causing the excitation light LL to be a parallel light. Accordingly, the reflection of the excitation light LL on the interior wall of the gas cell 2 can be simply and securely prevented. Therefore, the resonance of the excitation light in the gas cell 2 is properly caused to occur, and as a result, oscillation characteristics of the atomic oscillator 1 can be enhanced.

The optical component 42 is a polarization plate. Accordingly, the polarization of the excitation light LL can be adjusted from the light emitting portion 3 in a predetermined direction.

The optical component 43 is a neutral density filter (ND filter). Accordingly, the intensity of the excitation light LL that is incident on the gas cell 2 can be adjusted (decreased). Therefore, when the output of the light emitting portion 3 is great, excitation light that is incident on the gas cell 2 can be caused to be a desired amount of light. According to the embodiment, the intensity of the excitation light LL having the polarization in a predetermined direction that passes through the optical component 42 described above is adjusted by the optical component 43.

The optical component 44 is a λ/4 wave plate. Accordingly, the excitation light LL from the light emitting portion 3 can be converted from linear polarized light to circular polarized light (clockwise circular polarized light or counterclockwise circular polarized light).

In a state in which the alkali metal atoms in the gas cell 2 are Zeeman-split by a magnetic field of the magnetic field generating portion 8 as described below, if the alkali metal atoms are irradiated with the linearly polarized excitation light, the alkali metal atoms exist in a manner of being uniformly dispersed in a plurality of levels by Zeeman splitting due to the interaction between the excitation light and the alkali metal atom. As a result, since the number of alkali metal atoms in a desired energy level becomes relatively smaller than the number of alkali metal atoms in the other energy levels, the number of atoms that present a desired EIT phenomenon decreases to decrease the intensity of a desired EIT signal, and as a result, the oscillation characteristics of the atomic oscillator 1 decreases.

In contrast, as described below, in a state in which the alkali metal atom in the gas cell 2 is Zeeman-split in a magnetic field of the magnetic field generating portion 8, if the alkali metal atoms are irradiated with the circularly polarized excitation light, by using the interaction between the excitation light and the alkali metal atom, among the plurality of levels in which the alkali metal atoms are Zeeman-split, the number of the alkali metal atoms in a desired energy level can be caused to be relatively greater than the number of alkali metal atoms in the other energy levels. Therefore, the number of atoms presenting the desired EIT phenomenon increases so as to increase the intensity of the desired EIT signal, and as a result, the oscillation characteristics of the atomic oscillator 1 can be enhanced.

Light Detecting Portion

The light detecting portion 5 has a function of detecting the intensity of the excitation light LL (resonance lights 1 and 2) that penetrates the gas cell 2.

The light detecting portion 5 is not particularly limited, as long as it can detect the excitation light described above. For example, a light sensitive detector (photodetector) such as a solar cell or a photodiode may be used.

Heater

The heater 6 (heating portion) has a function of heating the aforementioned gas cell 2 (specifically, alkali metal in the gas cell 2). Accordingly, the alkali metal in the gas cell 2 can be maintained in a gaseous state in a proper concentration.

For example, the heater 6 is configured to include a heat resistor that generates heat by energization. The heat resistor may be provided to come into contact with the gas cell 2, or may be provided not to come into contact with the gas cell 2.

For example, if the heat resistor is provided to come into contact with the gas cell 2, respective heat resistors are provided on the pair of window portions of the gas cell 2. Accordingly, the condensation of the alkali metal atoms on the window portions of the gas cell 2 can be prevented. As a result, the characteristics (oscillation characteristics) of the atomic oscillator 1 can be caused to be excellent for a long period of time. The heat resistor is configured with a material that has transparency with respect to excitation light. Specifically, the heat resistor is configured with a transparent electrode material such as oxides including Indium Tin Oxide (ITO), Indium Zinc Oxide (IZO), $In_2O_3$, $SnO_2$, Sb-containing $SnO_2$, Al-containing ZnO, and the like. In addition, the heat resistor can be formed by using, for example, chemical vapor deposition (CVD) such as plasma CVD and thermal CVD, a dry plating method such as vacuum deposition, and a sol-gel method.

In addition, if the heat resistor is provided not to come into contact with the gas cell 2, heat may be transferred from the heat resistor to the gas cell 2 through a member made of ceramics or metal that has excellent thermal conductivity.

In addition, the heater 6 is not particularly limited as long as it can heat the gas cell 2. Various kinds of heaters may be used. In addition, instead of the heater 6, or together with the heater 6, the gas cell 2 may be heated by using a Peltier device.

Temperature Sensor

The temperature sensor 7 detects a temperature of the heater 6 or the gas cell 2. Then, the calorific value of the heater 6 described above is controlled based on the detection result of the temperature sensor 7. Accordingly, an alkali metal atom in the gas cell 2 is maintained to a desired temperature.

In addition, the installation position of the temperature sensor 7 is not particularly limited. For example, the temperature sensor 7 may be installed on the heater 6, or on the exterior surface of the gas cell 2.

The temperature sensor 7 is not particularly limited. Various well-known temperature sensors such as a thermistor and a thermocouple may be used.

Magnetic Field Generating Portion

The magnetic field generating portion 8 has a function of generating a magnetic field that causes a plurality of energy levels obtained by degenerating the alkali metal in the gas cell 2 to be Zeeman-split. Accordingly, a gap between different energy levels obtained by degenerating the alkali metal in the gas cell 2 is widened by Zeeman splitting so that the spatial resolution can be enhanced. As a result, the accuracy of the oscillation frequency of the atomic oscillator 1 can be enhanced.

For example, the magnetic field generating portion 8 is configured with Helmholtz coils arranged to interpose the gas cell 2 or solenoid coils arranged to cover the gas cell 2. Accordingly, uniform magnetic fields in one direction in the gas cell 2 can be caused to occur.

In addition, the magnetic field generated by the magnetic field generating portion 8 is a constant magnetic field (DC magnetic field), but AC magnetic fields may be superimposed.

Controller

The controller 10 may have a function of controlling the light emitting portion 3, the heater 6, and the magnetic field generating portion 8, respectively.

The controller 10 includes an excitation light controller 12 that controls frequencies of the resonance lights 1 and 2 of the light emitting portion 3, a temperature controller 11 that controls a temperature of the alkali metal in the gas cell 2, and a magnetic field controller 13 that controls the magnetic field from the magnetic field generating portion 8.

The excitation light controller 12 controls frequencies of the resonance lights 1 and 2 emitted from the light emitting portion 3 based on the detection result of the light detecting portion 5 described above. Specifically, the excitation light controller 12 controls frequencies of the resonance lights 1 and 2 emitted from the light emitting portion 3 so that the aforementioned frequency difference ($\omega 1-\omega 2$) becomes the aforementioned frequency $\omega 0$ which is unique to the alkali metal.

Here, although not illustrated, the excitation light controller 12 includes a voltage control-type crystal oscillator (oscillation circuit), while an oscillation frequency of the voltage control-type crystal oscillator is synchronized and adjusted based on the detection result of the light detecting portion 5, and the output signal of the voltage control-type crystal oscillator is output as an output signal of the atomic oscillator 1.

For example, although not illustrated, the excitation light controller 12 includes a multiplier that multiples a frequency of the output signal from the voltage control-type crystal oscillator, so that the signal (high frequency signal) multiplied by the multiplier is superimposed with a DC bias current, and input to the light emitting portion 3 as a drive signal. Accordingly, the voltage control-type crystal oscillator is controlled so that the EIT signal is detected in the light detecting portion 5, and thus the signal at a desired frequency can be output from the voltage control-type crystal oscillator. For example, when the desired frequency of the signal output from the atomic oscillator 1 is f, a multiplication rate of the multiplier is $\omega 0/(2\times f)$. Accordingly, when the oscillation frequency of the voltage control-type crystal oscillator is f, a light emitting element such as a semiconductor laser included in the light emitting portion 3 is modulated by using the signal from the multiplier so that two light beams in which the frequency difference ($\omega 1-\omega 2$) becomes $\omega 0$ can be emitted.

In addition, the temperature controller 11 controls energization to the heater 6 based on the detection result of the temperature sensor 7. Accordingly, the gas cell 2 can be maintained to a desired temperature scope. For example, the temperature of the gas cell 2 is adjusted by the heater 6, for example, to be about 70° C.

Also, the magnetic field controller 13 controls the energization to the magnetic field generating portion 8 so that the magnetic field generated by the magnetic field generating portion 8 becomes constant.

For example, the controller 10 is provided in the IC chip mounted on a substrate.

In the above, the configuration of the atomic oscillator 1 is briefly described.

Detailed Description of Gas Cell

Figure 4:
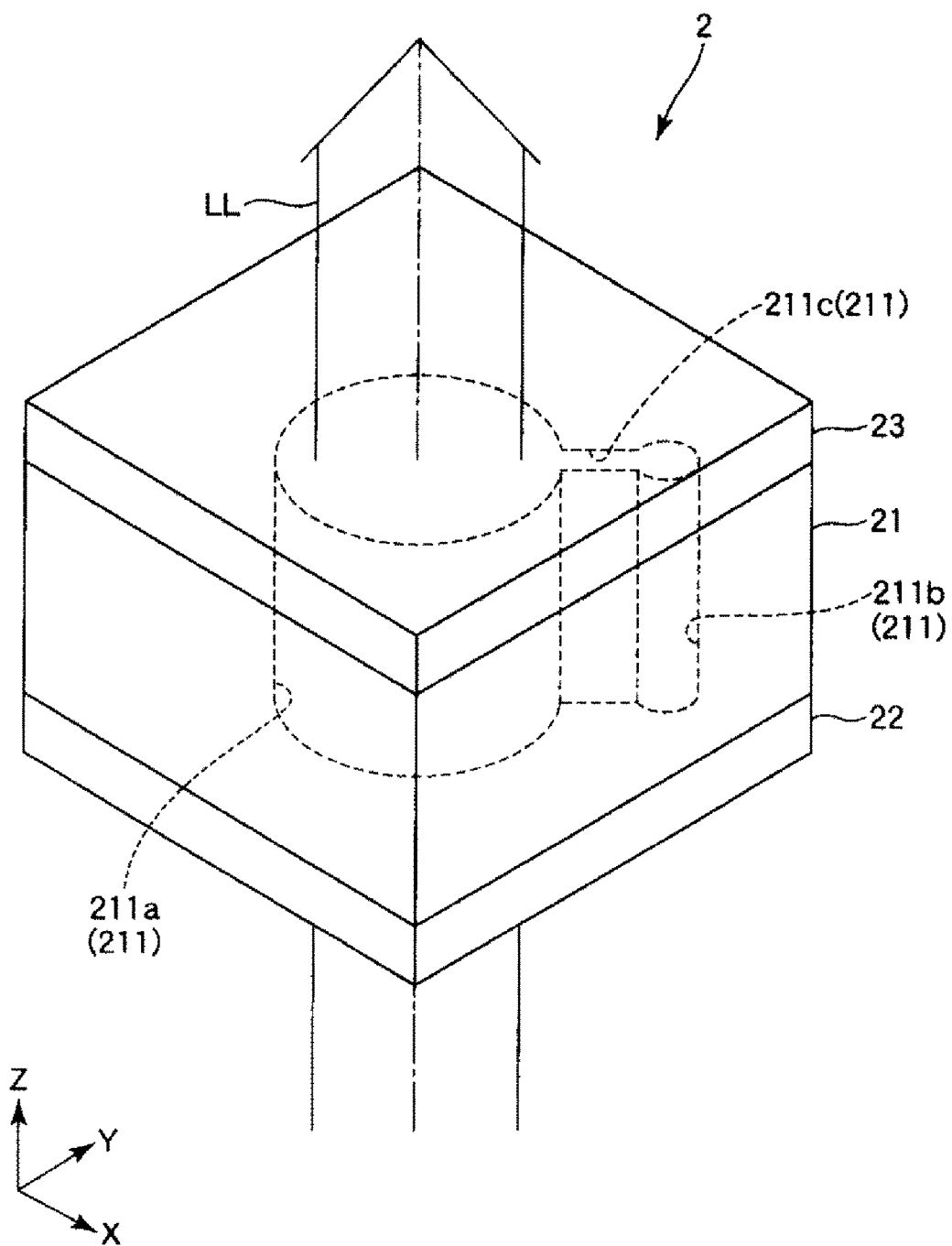
FIG. 4 is a perspective view illustrating an atomic cell included in the atomic oscillator illustrated in FIG. 1.
Figure 5A:
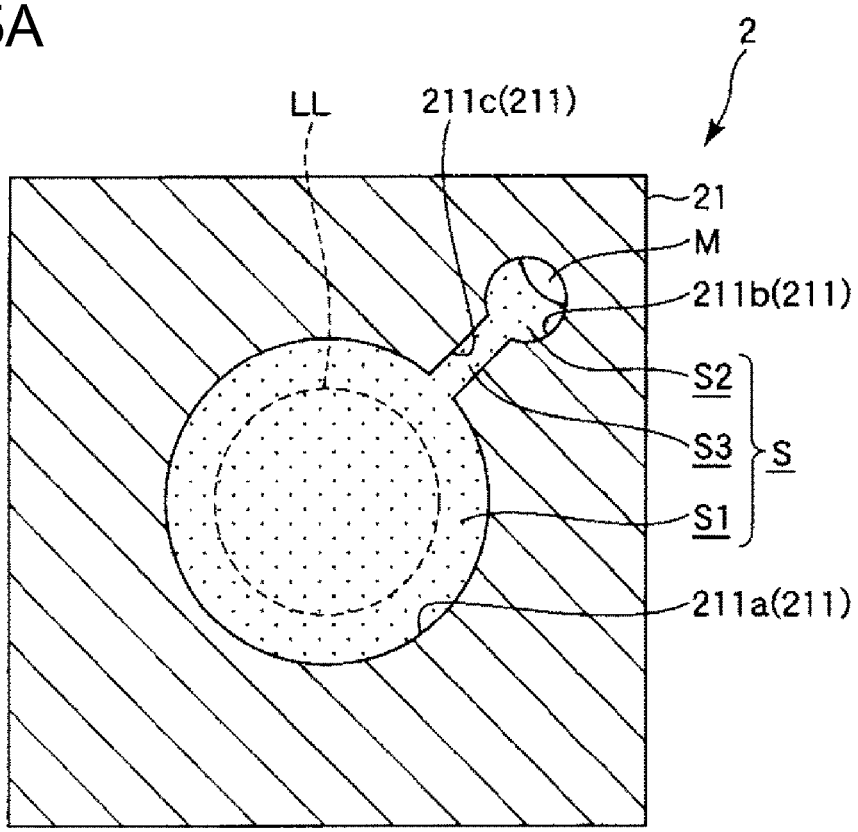
FIG. 5A is a horizontal cross-sectional view illustrating the atomic cell illustrated in FIG. 4.

FIG. 4 is a perspective view illustrating an atomic cell included in the atomic oscillator illustrated in FIG. 1. FIG. 5A is a horizontal cross-sectional view illustrating the atomic cell illustrated in FIG. 4, and FIG. 5B is a vertical cross-sectional view illustrating an atomic cell illustrated in FIG. 4.

Also, in FIG. 4, for convenience of explanation, an X axis, a Y axis, and a Z axis are illustrated as three axes orthogonal to each other. Distal ends of the respective illustrated arrows are referred to as "plus (+)" sides, and base ends thereof are referred to as "minus (−)" sides. Also, in the following, for convenience of explanation, a direction parallel to the X axis is referred to as the "X axis direction", a direction parallel to the Y axis is referred to as the "Y axis direction", and a direction parallel to the Z axis is referred to as the "Z axis direction". In addition, the +Z axis direction side is referred to as an "upper" side, and the −Z axis direction side is referred to as a "lower" side.

Figure 5B:
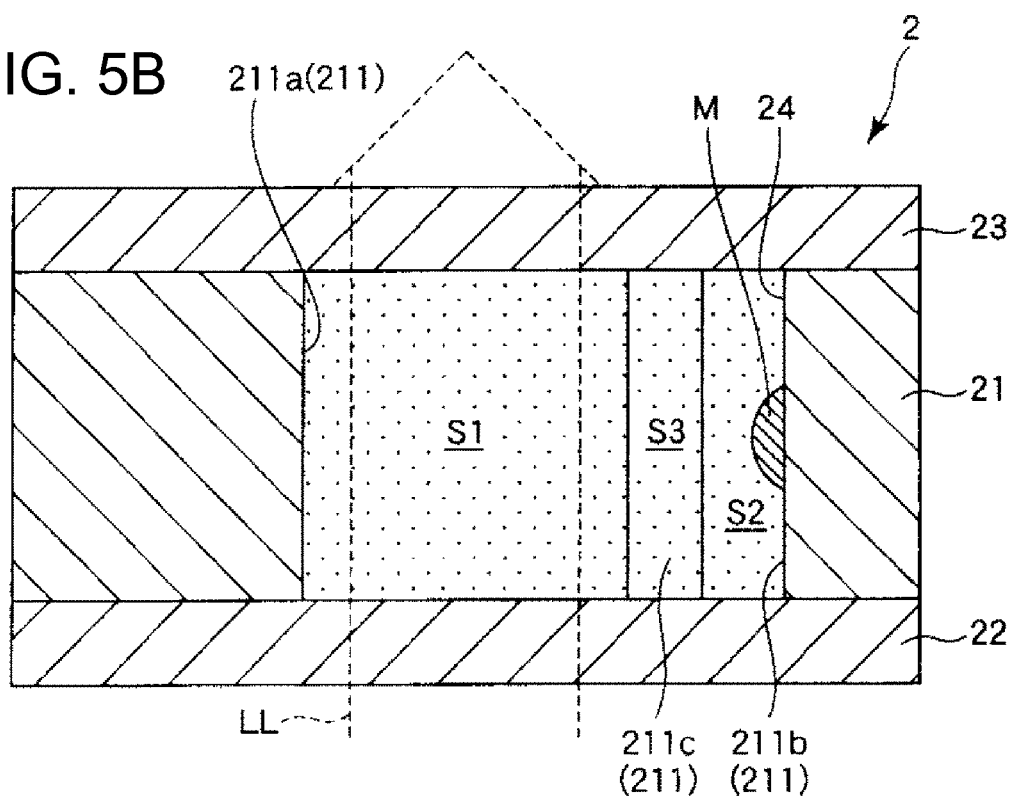
FIG. 5B is a vertical cross-sectional view illustrating the atomic cell illustrated in FIG. 4.

As illustrated in FIGS. 4 to 5B, the gas cell 2 includes a trunk portion 21 (a body) and a pair of window portions 22 and 23 (a top and a bottom) that interpose (sandwich) the trunk portion 21 therebetween.

In the trunk portion 21, through holes 211 that penetrate the trunk portion 21 in a Z axis direction are formed. The through holes 211 are configured as columnar through holes 211a and 211b and a slit-shaped through hole 211c (a channel or slot) that causes the through holes 211a and 211b to communicate with each other. Here, a holding portion 24 (metal retaining portion) that maintains the liquid alkali metal M is provided on the interior wall surface of the through hole 211b. The holding portion 24 is specifically described below.

The constituents of the trunk portion 21 are not particularly limited. A glass material, crystal, a metal material, a resin material, a silicon material, or the like may be used. Among them, any one of the glass material, the crystal, and the silicon material is preferably used, and the silicon material is more preferably used. Accordingly, even if the small gas cell 2 having a width or a thickness of 10 mm or less is formed, the trunk portion 21 can be highly accurately and easily formed by using a micro-machining technique such as etching.

The window portion 22 is joined to the end surface (lower end surface) of the trunk portion 21 in the −Z axis direction side, and the window portion 23 is joined to the end surface (upper end surface) of the trunk portion 21 in the +Z axis direction. Accordingly, the both end openings of the through holes 211 are blocked, and an internal space S including a space S1 within the through hole 211a, a space S2 within the through hole 211b, and a space S3 within the through hole 211c is formed. The alkali metal is stored in the internal space S. Here, the trunk portion 21 and a pair of window portions 22 and 23 may be referred to as "wall portions" that configure the internal space S in which alkali metal is enclosed.

A method of joining the trunk portion 21 and the window portions 22 and 23 can be determined according to the constituent elements. The method is not particularly limited, as long as it can air-tightly join the portions. For example, a joining method using an adhesive, a direct joining method, and an anode joining method may be used.

In the space S1, gaseous alkali metal is mainly stored, and the gaseous alkali metal stored in the space S1 is excited by the excitation light LL. That is, the space S1 configures a "light passing space" through which the excitation light LL passes. According to the embodiment, the horizontal cross section of the space S1 is circular, and the horizontal cross section of the light passing space has a shape similar to the horizontal cross section of the space S1 and is set to be slightly smaller than the horizontal cross section of the space S1. Also, the horizontal cross sectional shape of the space S1 is not limited to be a circular shape, but may be a polygonal shape such as a rectangular shape, a pentagonal shape, an elliptical shape and the like.

The space S2 is a metal reservoir portion in which the liquid or solid alkali metal M is stored. The space S2 communicates with the space S1 via the space S3. Accordingly, when the gaseous alkali metal in the space S1 is deficient, the alkali metal M becomes a gaseous form so as to maintain steam pressure and is supplied for the excitation of the excitation light LL. The width of the space S2 (length of cross section along XY plane) is narrower than the width of the space S1. Accordingly, it is possible to minimize the size of the gas cell 2.

As described above, the spaces S1, S2, and S3 are formed by blocking both end openings of the through holes 211 formed in the trunk portion 21 by the pair of window portions 22 and 23. Accordingly, the small gas cell 2 having the spaces S1, S2, and S3 can be highly accurately and easily formed. Specifically, the trunk portion 21 can be highly accurately and easily formed, for example, by machining a substrate such as a silicon substrate or a glass substrate by a micro-machining technique such as etching. Therefore, the small gas cell 2 can be highly accurately and easily formed. Particularly, the atomic oscillator for CPT can be minimized more than an atomic oscillator using a double resonance phenomenon. Recently, since integration with various apparatuses is expected and a further demand for minimization becomes great, the effect of highly accurately and easily forming the small gas cell 2 becomes important in the atomic oscillator 1 for CPT.

The specific width of the space S2 is determined according to the volume of the excess alkali metal M or the entire volume of the gas cell 2, and is not particularly limited. However, the specific width is preferably in a range of 0.1 mm to 2 mm, and more preferably in a range of 0.1 mm to 1 mm.

In addition, according to the embodiment, as illustrated in FIG. 5A, when viewed in the Z axis direction, the space S2 has a circular shape. However, the horizontal cross sectional shape of the space S2 is not limited to a circular shape. The horizontal cross sectional shape may be, for example, a polygonal shape such as a rectangular shape, a pentagonal shape, an elliptical shape and the like.

In addition, the space S3 that causes the space S1 and the space S2 to communicate with each other has a linearly extending shape when viewed in the Z axis direction. In addition, the horizontal cross sectional shape of the space S3 may have a bent portion or a curved portion.

The width of the space S3 is narrower than that of the space S2. Accordingly, while the size of the space S2 that stores the alkali metal M is maintained, the influence of the alkali metal M on the gaseous alkali metal in the space S1 can be reduced. In addition, the width of the space S3 may be the same as that of the space S2. Also, the space S3 may cause the space S1 and the space S2 to communicate with each other, or may be formed without extending entirely through the trunk portion 21 in the Z axis direction. In this case, a groove may be formed along a surface on one end side of the trunk portion 21 (one end in the Z axis direction).

The respective window portions 22 and 23 joined to the trunk portion 21 have transparency with respect to the excitation light from the light emitting portion 3. Also, the window portion 22 on one side is an incident-side window portion through which the excitation light LL is incident on the space S1 of the gas cell 2, and the window portion 23 on the other side is an emission-side window portion through which the excitation light LL is emitted from the space S1 of the gas cell 2.

The window portions 22 and 23 have a sheet or plate shape, respectively.

The constituent material of the window portions 22 and 23 is not particularly limited, as long as they have transparency with respect to the excitation light as described above. However, for example, a glass material and crystal may be used. If the window portions 22 and 23 are configured with a glass material, the trunk portion 21 configured with a silicon material and the window portions 22 and 23 may be easily and air-tightly bonded by an anode joining method. In addition, the window portions 22 and 23 may be configured with silicon according to thicknesses of the window portions 22 and 23 or the wavelength or the intensity of excitation light.

In the gas cell 2 configured as described above, a portion of the alkali metal exists in the internal space S as the liquid alkali metal M as described above. In this manner, when the liquid alkali metal M exists in the internal space S as an excess, if the liquid alkali metal M is moved or shaken, the characteristics typically decrease.

Here however, as described above, the holding portion 24 (metal retaining portion) that holds the liquid alkali metal M is provided on an interior wall surface of the through hole 211b. Hereinafter, the holding portion 24 is described in detail.

Figure 6A:
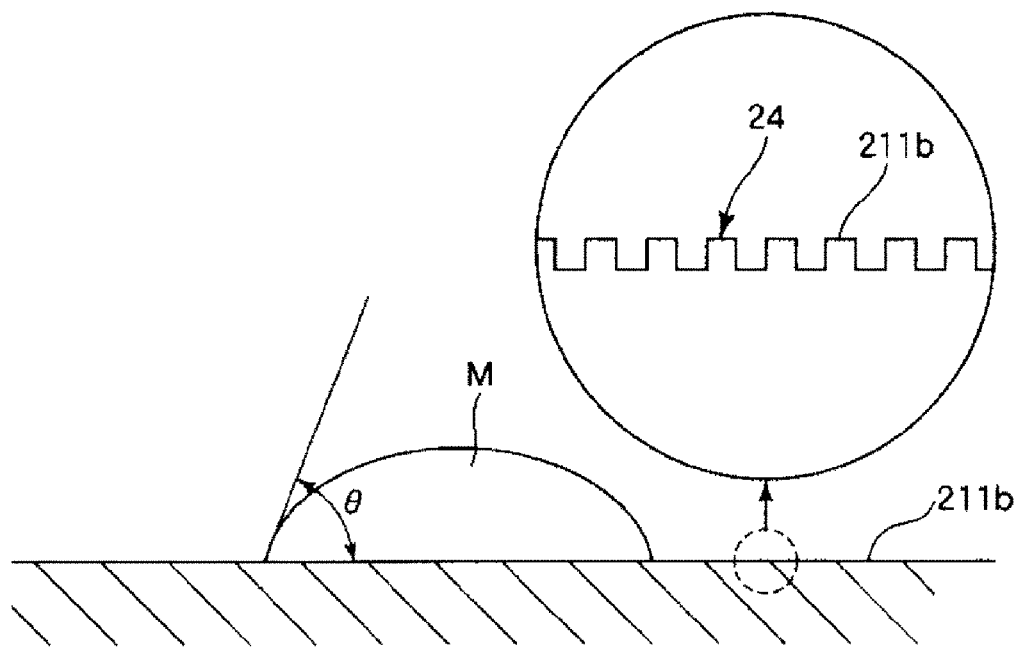
FIG. 6A is a diagram illustrating a state of liquid metal in a metal retaining portion (metal reservoir portion) illustrated in FIGS. 5A and 5B.
Figure 6B:
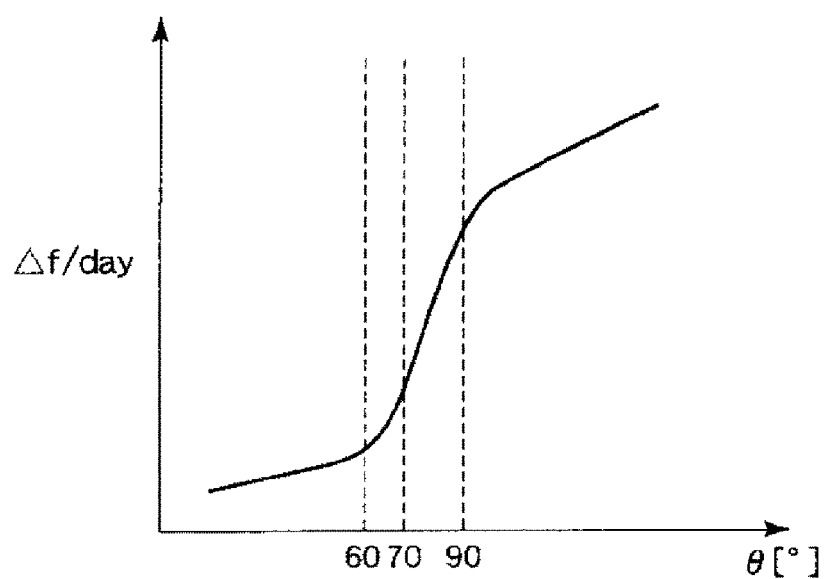
FIG. 6B is a graph illustrating a relationship between a contact angle with the liquid metal to an interior wall surface of the atomic cell and a frequency change.

FIG. 6A is a diagram illustrating a state of liquid metal in the metal retaining portion (metal reservoir portion) illustrated in FIGS. 5A and 5B, and FIG. 6B is a graph illustrating a relationship between a contact angle of the liquid metal to an interior wall surface of an atomic cell and frequency change.

The holding portion 24 is configured so that a contact angle θ of the liquid alkali metal M is less than 90° as illustrated in FIG. 6A. Accordingly, since the wettability of the holding portion 24 with respect to the liquid alkali metal M is high, the excess liquid alkali metal M is spread out along the holding portion 24 so that the excess liquid alkali metal M can be stably maintained. Therefore, the movement or shaking of the liquid alkali metal M can be decreased (that is, the movement of the liquid alkali metal M in the gas cell 2 can be stabilized), and as a result, the decrease of the characteristics caused by the excess alkali metal M can be suppressed.

According to the embodiment, since the holding portion 24 is provided in the space S2 which is a metal reservoir portion, the liquid alkali metal M can be maintained in a portion of the gas cell 2 in which the influence on the characteristics of the gas cell 2 is small.

As illustrated in FIG. 6A, the holding portion 24 is formed by performing a roughening treatment on the interior wall surface adjacent the through hole 211b. That is, the holding portion 24 is configured with a plurality of fine concave or convex portions. According to the embodiment, the surface of the holding portion 24 is roughened by etching. Accordingly, the excess liquid alkali metal M is spread out along the holding portion 24 so that the excess liquid alkali metal M can be stably maintained by a relatively simple configuration. For example, if the trunk portion 21 and the window portions 22 and 23 are configured with silicon or glass, convex portions or concave portions of the holding portion 24 as described above can be formed by dry etching using fluorine plasma.

In addition, it is preferable that the roughening treatment is not performed on surfaces at the interfaces between the trunk portion 21 and the window portions 22 and 23. Accordingly, the trunk portion 21 and the window portions 22 and 23 can be simply and securely bonded together.

Also, it is preferable that the roughening treatment is not performed on surfaces through which the excitation light LL of the window portions 22 and 23 passes. In this manner, the pair of window portions 22 and 23 are configured to have a portion having a greater contact angle of the liquid alkali metal M than that in the holding portion 24 so that the likelihood of attachment of the liquid alkali metal to the window portions 22 and 23 can be decreased. Particularly, the decrease of the characteristics caused by the attachment of the liquid alkali metal to surfaces through which the excitation light LL of the window portions 22 and 23 passes can be prevented.

In addition, if the contact angle θ of the liquid alkali metal M to the holding portion 24 is in a range of 0° to 90°, a frequency fluctuation amount Δf per day can be effectively caused to be small as illustrated in FIG. 6B. However, in view of the enhancement of the wettability of the liquid alkali metal M to the holding portion 24, the contact angle θ is preferably less than 70°, and more preferably less than 60°.

In addition, in view of the prevention of the decrease of the characteristics caused by the attachment of liquid alkali metal to the surface through which the excitation light LL of the window portions 22 and 23 passes, a contact angle of the liquid alkali metal to the surface (interior wall surface)

through which the excitation light LL of the window portions 22 and 23 passes is preferably 90° or greater, and more preferably 100° or greater.

In addition, an average roughness Ra (hereinafter, referred to as a "surface roughness Ra") of the holding portion 24 is preferably in a range of 10 nm to 980 nm, more preferably in a range of 100 nm to 800 nm, and particularly preferably in a range of 300 nm to 700 nm. Accordingly, with a relatively simple configuration, the excess liquid alkali metal M is spread out along the holding portion 24 so that the excess liquid alkali metal M can be stably and securely maintained. In addition, the surface roughness Ra can be measured based on JIS B0601:2001 by using, for example, a stylus-type surface roughness meter, a non contact-type surface roughness meter using a laser or the like and an atomic force microscope (AFM). JIS is an abbreviation of Japanese Industrial Standards, and JIS B0601:2001 is a standard conforming to ISO 4287:1997.

In addition, it is preferable that the trunk portion 21 and the window portions 22 and 23 are configured with silicon or glass, respectively. Accordingly, the holding portion 24 which has the plurality of concave portions and convex portions formed by etching or deposition as described above while the basic functions desired of the gas cell 2 are secured can be formed relatively easily.

Second Embodiment

Subsequently, a second embodiment according to the invention is described.

Figure 7A:
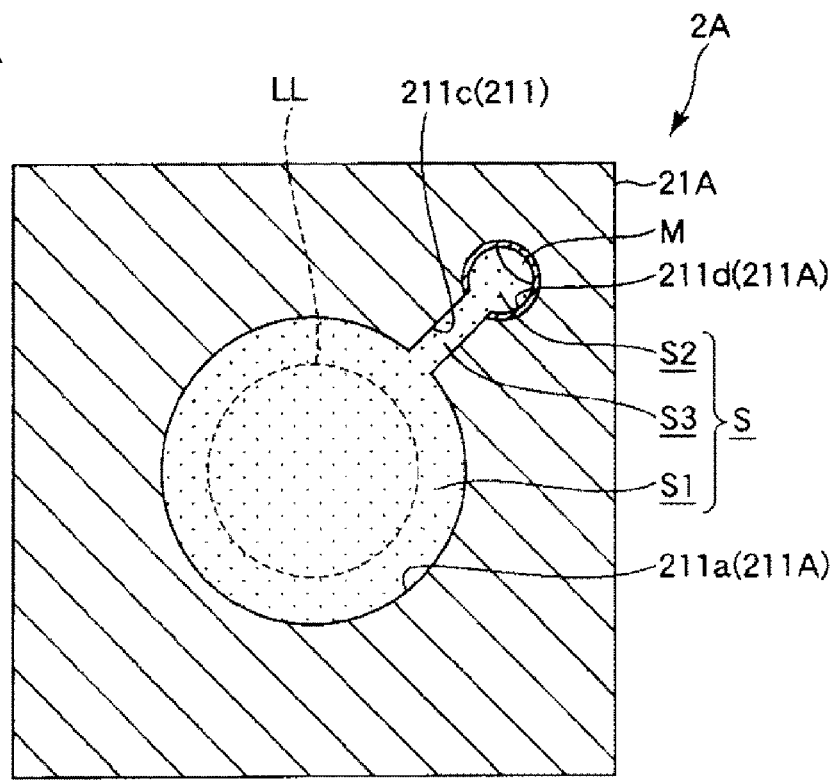
FIG. 7A is a horizontal cross-sectional view illustrating an atomic cell according to a second embodiment of the invention.
Figure 7B:
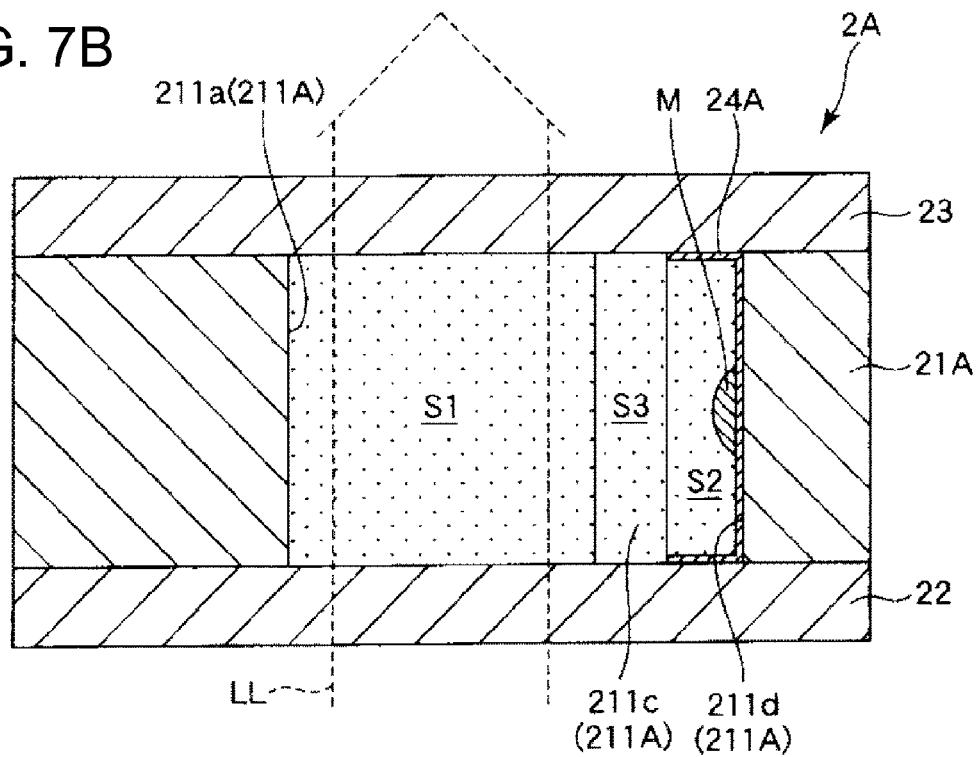
FIG. 7B is a vertical cross-sectional view illustrating the atomic cell illustrated in FIG. 7A.
Figure 8:
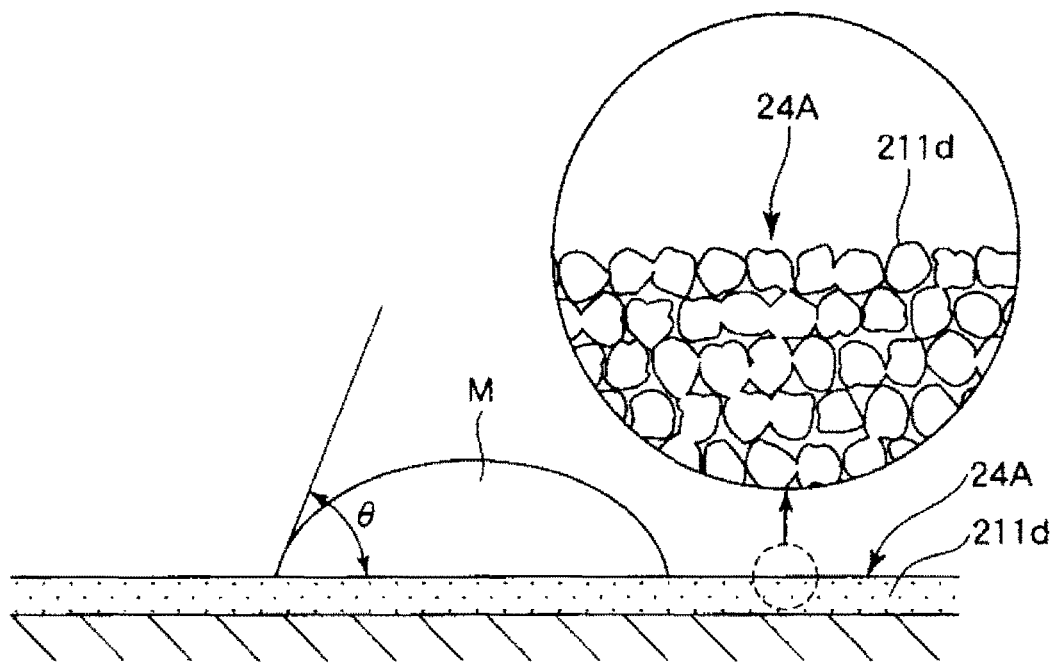
FIG. 8 is a diagram illustrating a state of the liquid metal in a metal retaining portion (metal reservoir portion) illustrated in FIGS. 7A and 7B.

FIG. 7A is a horizontal cross-sectional view illustrating an atomic cell according to the second embodiment of the invention, and FIG. 7B is a vertical cross-sectional view illustrating the atomic cell illustrated in FIG. 7A. In addition, FIG. 8 is a diagram illustrating a state of the liquid metal in a metal retaining portion (metal reservoir portion) illustrated in FIGS. 7A and 7B.

The second embodiment is the same as the first embodiment except that a configuration of the metal retaining portion is different.

In the description below, the second embodiment is described with reference to differences from the first embodiment, and descriptions on similarities are omitted. Also, in FIGS. 7A to 8, the same configurations as in the first embodiment described above are denoted by the same reference numerals.

A gas cell 2A (atomic cell) illustrated in FIGS. 7A and 7B includes a trunk portion 21A instead of the trunk portion 21 according to the first embodiment.

In the trunk portion 21A, a through hole 211A that penetrates the trunk portion 21A in a Z axis direction is formed. The through hole 211A includes the columnar through holes 211a and 211d and the slit-shaped through hole 211c that causes the through holes 211a and 211d to communicate with each other.

A holding portion 24A that holds the liquid alkali metal M is provided on the interior wall surface of the through hole 211d. As illustrated in FIG. 8, the holding portion 24A is configured with a porous membrane. By providing the porous membrane, a similar effect to the roughening treatment on the holding portion 24 according to the first embodiment described above can be obtained. Also, with a comparatively simple configuration, excess liquid alkali metal can be spread out along the holding portion 24A so that the excess liquid alkali metal can be stably maintained.

The holding portion 24A configured with the porous membrane is configured with, for example, an inorganic porous material such as porous polysilicon or porous silica. In addition, the formation of the holding portion 24A may be performed by using a vapor phase film deposition method such as CVD, or may be performed by applying inorganic fine particles including an organic binder and then firing and sintering the inorganic fine particles.

According to the second embodiment as described above, the decrease of the characteristics caused by the excess alkali metal M can be suppressed.

Third Embodiment

Subsequently, a third embodiment of the invention is described.

Figure 9A:
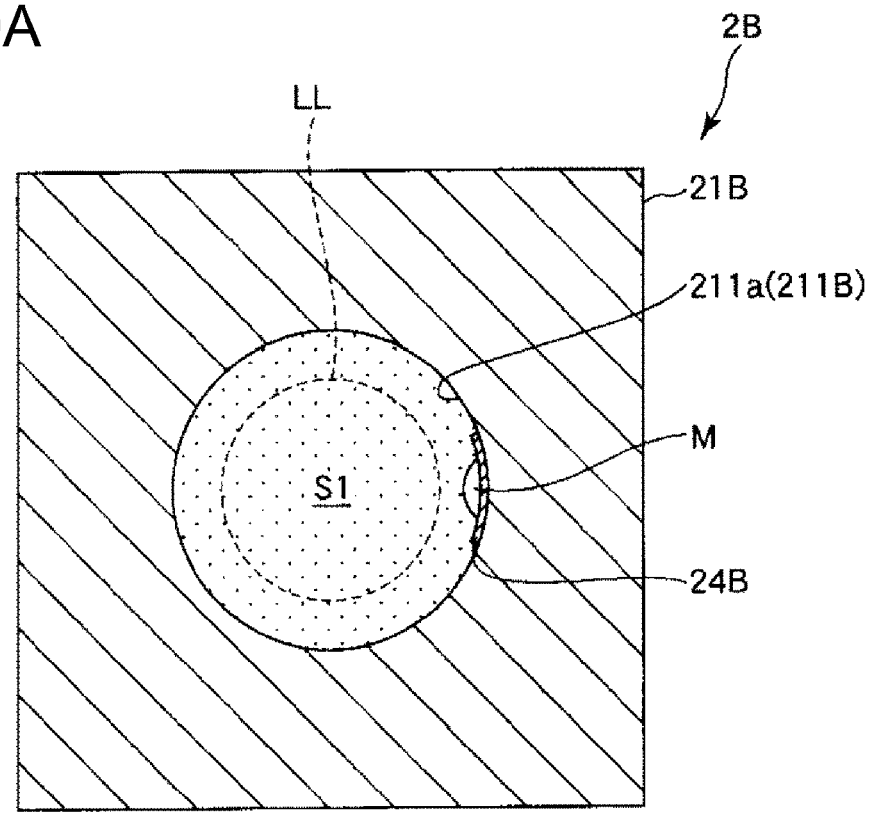
FIG. 9A is a horizontal cross-sectional view illustrating an atomic cell according to a third embodiment of the invention.
Figure 9B:
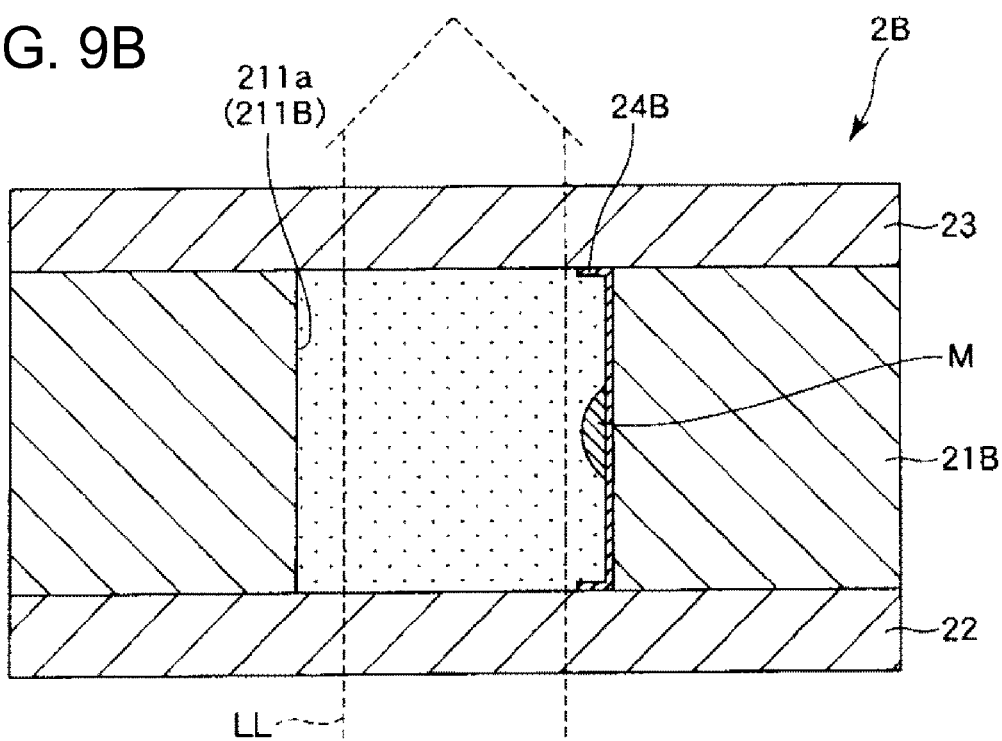
FIG. 9B is a vertical cross-sectional view illustrating the atomic cell illustrated in FIG. 9A.

FIG. 9A is a horizontal cross-sectional view illustrating an atomic cell according to a third embodiment of the invention, and FIG. 9B is a vertical cross-sectional view illustrating the atomic cell illustrated in FIG. 9A.

The third embodiment is the same as the first embodiment described above except that a shape of the internal space of the atomic cell and a configuration of the metal retaining portion are different. In addition, the third embodiment of the invention is the same as the second embodiment described above except that a shape of the internal space of the atomic cell is different.

In the description below, the third embodiment is described with reference to differences from the embodiments described above, and descriptions on similarities are omitted. Also, in FIGS. 9A and 9B, the same configurations as in the embodiments described above are denoted by the same reference numerals.

A gas cell 2B (atomic cell) illustrated in FIGS. 9A and 9B includes a trunk portion 21B instead of the trunk portion 21 according to the first embodiment.

In the trunk portion 21B, a through hole 211B that penetrates the trunk portion 21B in a Z axis direction is formed. The through hole 211B includes the columnar through hole 211a.

A holding portion 24B that holds the liquid alkali metal M is provided on the interior wall surface of the through hole 211B. Accordingly with a comparatively simple configuration, excess liquid alkali metal can be spread out along the holding portion 24A so that the excess liquid alkali metal can be stably maintained. Here, according to the third embodiment, it is considered that the holding portion 24B configures a "metal reservoir portion", a space S which is a light passing space formed by the through hole 211B includes a metal reservoir portion.

In addition, the holding portion 24B is not provided on interfaces between the trunk portion 21B and the window portions 22 and 23. Accordingly, the air-tight bonding between the trunk portion 21B and the window portions 22 and 23 can be easily and securely performed.

In addition, the holding portion 24B is formed on interior wall surfaces of the window portions 22 and 23, but the holding portion 24B is not formed on portions through which the excitation light LL of the window portions 22 and 23 passes. Accordingly, the decrease of the characteristics caused by the attachment of the liquid alkali metal to surfaces through which the excitation light LL of the window portions 22 and 23 passes can be prevented.

According to the third embodiment as described above, the decrease of the characteristics caused by the excess alkali metal M can be suppressed.

2. Electronic Device

The atomic oscillator described above can be integrated into various electronic devices. The electronic devices have excellent reliability.

Hereinafter an electronic device according to an embodiment of the invention is described.

Figure 10:
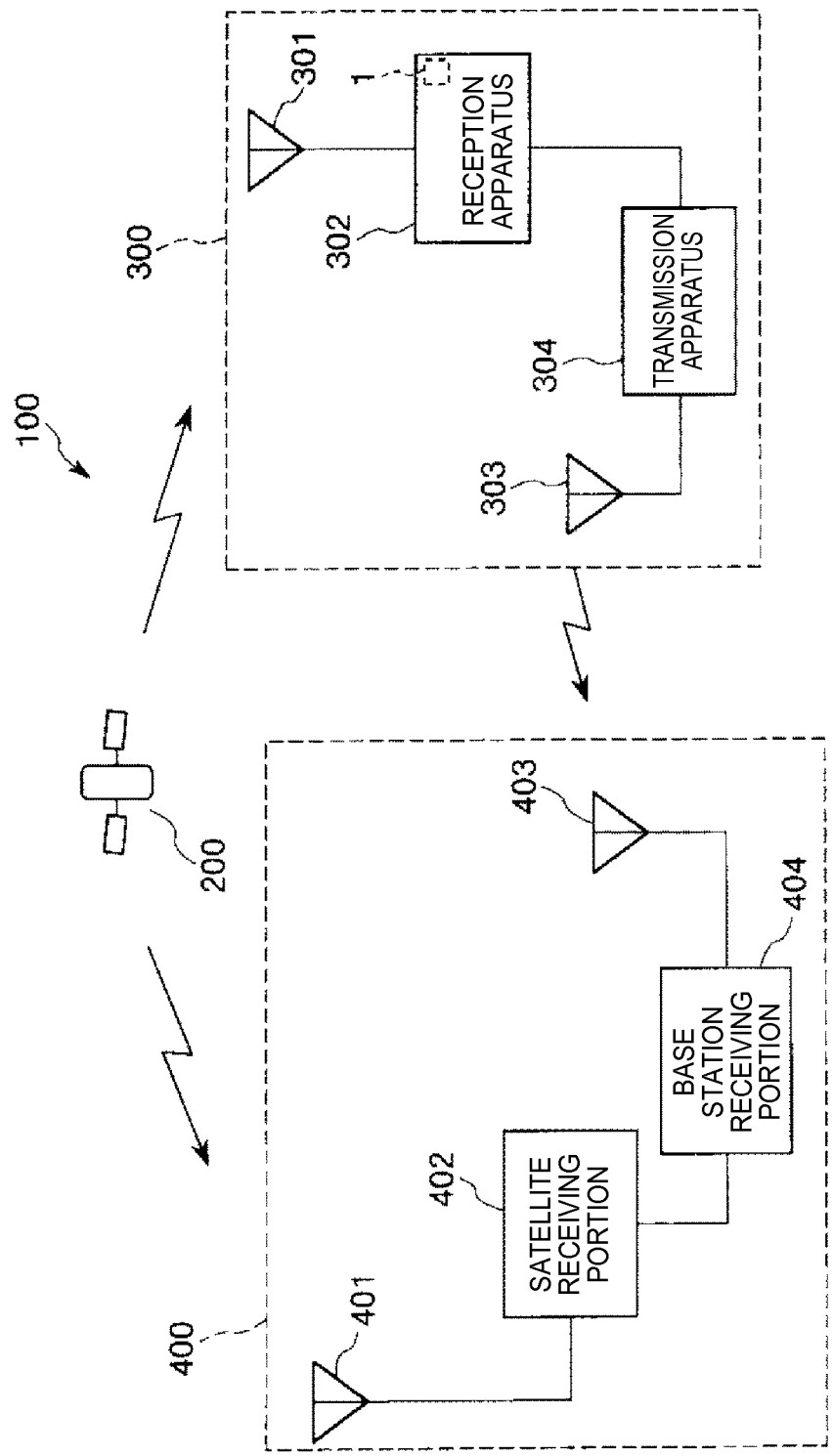
FIG. 10 is a diagram schematically illustrating a configuration when an atomic oscillator according to the invention is used in a positioning system using a GPS satellite.

FIG. 10 is a diagram schematically illustrating a configuration when an atomic oscillator according to the invention is used in a positioning system using a GPS satellite.

A positioning system 100 illustrated in FIG. 10 includes a GPS satellite 200, a base station apparatus 300, and a GPS signal receiving apparatus 400.

The GPS satellite 200 transmits positioning information (GPS signal).

For example, the base station apparatus 300 includes a reception apparatus 302 that highly accurately receives positioning information from the GPS satellite 200 via an antenna 301 positioned at an electronic reference point (GPS continuous observation station) and a transmission apparatus 304 that transmits the positioning information received by the reception apparatus 302 via an antenna 303.

Here, the reception apparatus 302 is an electronic device including the atomic oscillator 1 according to the invention described above, as a reference frequency oscillation source. The reception apparatus 302 has excellent reliability. In addition, the positioning information received by the reception apparatus 302 is transmitted by the transmission apparatus 304 in real time.

A GPS signal receiving apparatus 400 includes a satellite receiving portion 402 that receives positioning information from the GPS satellite 200 via an antenna 401 and a base station receiving portion 404 that receives positioning information from the base station apparatus 300 via an antenna 403.

3. Moving Object

Figure 11:
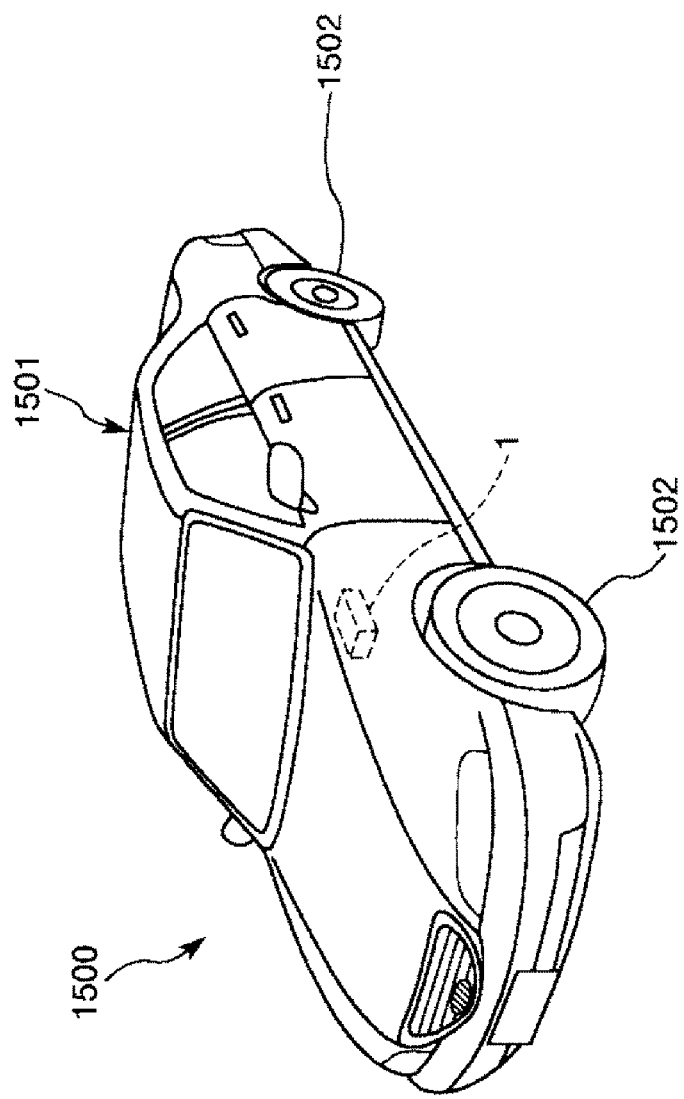
FIG. 11 is a diagram illustrating an example of a moving object according to the invention.

FIG. 11 is a diagram illustrating an example of a moving object according to the invention.

In FIG. 11, a moving object 1500 includes a vehicle body 1501 and 4 wheels 1502, and is configured so that the wheels 1502 are rotated by a power source (engine) which is not illustrated but which is provided in the vehicle body 1501. In the moving object 1500, the atomic oscillator 1 is embedded.

According to the moving object, excellent reliability can be achieved.

Also, the electronic device according to the invention is not limited to the above, but can be applied to, for example, an electronic apparatus such as a cellular phone, a digital still camera, an ink jet ejection device (for example, an ink jet printer), a personal computer (a mobile type personal computer or a laptop type personal computer), a television set, a video camera, a video cassette recorder, a car navigation system, a pager, a personal digital assistance (including one with a communication function), an electronic dictionary, an electric calculator, a computerized game machine, a word processor, a workstation, a video phone, a security video monitor, a pair of electronic binoculars, a POS terminal, a medical device (for example, an electronic thermometer, an electronic manometer, an electronic blood sugar meter, an electrocardiogram measurement instrument, an ultrasonograph, and an electronic endoscope), a fish finder, various measurement instruments, various gauges (for example, gauges for a vehicle, an aircraft, or a ship), a flight simulator, a terrestrial digital broadcasting system, and a mobile phone base station.

In the above, the atomic cell, the quantum interference device, the atomic oscillator, the electronic device and the moving object according to the invention are described with reference to the accompanying drawings. However, the invention is not limited thereto.

In addition, configurations of the respective portions according to the invention can be substituted with arbitrary configurations that achieve the same function as the embodiments described above, and an arbitrary configuration can be added.

In addition, the invention may be a combination between arbitrary configurations of the respective embodiments described above.

In addition, according to the embodiments described above, a case in which an atomic cell according to the invention is used in a quantum interference device that causes cesium or the like to resonate and transition by using the coherent population trapping caused by two lights having different wavelengths is described as an example. However, the atomic cell according to the invention is not limited thereto, and may be used in a double resonance device that causes rubidium or the like to resonate and transition by using a double resonance phenomenon caused by light and microwaves.

The entire disclosure of Japanese Patent Application No. 2014-059250 filed Mar. 20, 2014 is expressly incorporated by reference herein.

What is claimed is:

1. An atomic cell comprising:
   a body having a first end opposite to a second end, and an open interior space extending from the first end to the second end, the body being configured such that light travelling in a light passing direction enters the body from the first end, passes through the interior space of the body, and exits the body from the second end;
   a wall provided in the body between the first and second ends, the wall configuring a periphery of the interior space;
   a gaseous metal enclosed within the interior space; and
   a liquid metal enclosed within the interior space,
   wherein the wall is configured with a metal retaining interior wall surface on which the liquid metal is retained,
   the metal retaining interior wall surface axially extends in the light passing direction, and
   a contact angle of the liquid metal with respect to the metal retaining interior wall surface in the light passing direction is less than 90°, and
   a contact angle of the liquid metal with respect to each of the first and second ends is larger than the contact angle of the liquid metal with respect to the metal retaining interior wall surface.

2. The atomic cell according to claim 1,
   wherein the contact angle of the liquid metal with respect to the metal retaining interior wall surface is less than 70°.

3. The atomic cell according to claim 2,
   wherein the contact angle of the liquid metal with respect to the metal retaining interior wall surface is less than 60°.

4. The atomic cell according to claim 1,
   wherein the internal space includes a metal reservoir,
   the metal reservoir includes the metal retaining interior wall surface, and
   the metal reservoir is a through-hole extending from the first end to the second end in the light passing direction.

5. The atomic cell according to claim 1,
   wherein a surface roughness Ra of the metal retaining interior wall surface is in a range of 10 nm to 980 nm.

6. The atomic cell according to claim 1,
wherein the metal retaining interior wall surface includes a porous membrane.

7. The atomic cell according to claim 4,
wherein the metal retaining interior wall surface of the metal reservoir is a roughened etched surface.

8. The atomic cell according to claim 1,
wherein the wall is configured with a material including at least one of silicon and glass.

9. The atomic cell according to claim 1, further comprising:
a pair of windows that are respectively provided on the first and second ends of the body so as to sandwich the body therebetween, and
wherein internal surfaces of the pair of windows, which face the interior space, have greater contact angles with respect to the liquid metal than the metal retaining interior wall surface.

10. A quantum interference device comprising:
the atomic cell according to claim 1.

11. An atomic oscillator comprising:
the atomic cell according to claim 1.

12. An electronic device comprising:
the atomic cell according to claim 1.

13. A moving object comprising:
the atomic cell according to claim 1.

14. An atomic cell comprising:
a body having a first end opposite to a second end, and an open interior space extending from the first end to the second end, the body being configured such that light travelling in a light passing direction enters the body from the first end, passes through the interior space of the body, and exits the body from the second end;
a circumferential wall provided in the body between the first and second ends, the circumferential wall configuring a periphery of the interior space;
a transparent top hermetically sealed to the first end of the body so as to entirely overlap the circumferential wall;
a transparent bottom hermetically sealed to the second end of the body so as to entirely overlap the circumferential wall;
a gaseous alkali metal in the interior space;
a liquid alkali metal in the interior space; and
a metal retaining interior surface on the circumferential wall, the metal retaining interior surface being configured to retain the liquid alkali metal, the metal retaining interior surface extending in the light passing direction, the liquid alkali metal having a contact angle with respect to the metal retaining interior surface in the light passing direction of less than 90°, and
a contact angle of the liquid alkali metal with respect to each of the first and second ends is larger than the contact angle with respect to the metal retaining interior surface.

15. The atomic cell according to claim 14,
wherein the contact angle with resect to the metal retaining interior surface is less than 70°.

16. The atomic cell according to claim 15,
wherein the contact angle with respect to the metal retaining interior surface is less than 60°.

17. The atomic cell according to claim 14,
wherein a surface roughness Ra of the metal retaining interior surface is in a range of 10 nm to 980 nm.

18. The atomic cell according to claim 14,
wherein the metal retaining interior surface includes a porous membrane.

19. The atomic cell according to claim 14,
wherein the transparent top and transparent bottom include surfaces facing the interior space, and the surfaces have greater contact angles with respect to the liquid alkali metal than the metal retaining interior surface.

20. An atomic cell comprising:
a body having a first end opposite to a second end, and an open interior space extending from the first end to the second end, the body being configured such that light travelling in a light passing direction enters the body from the first end, passes through the interior space of the body, and exits the body from the second end;
a wall provided in the body between the first and second ends, the wall configuring a periphery of the interior space;
a gaseous metal enclosed within the interior space; and
a liquid metal enclosed within the interior space,
wherein the wall is configured with a metal retaining interior wall surface on which the liquid metal is retained,
the metal retaining interior wall surface axially extends in the light passing direction, and
a contact angle of the liquid metal with respect to the metal retaining interior wall surface in the light passing direction is less than 90°, and
wherein the metal retaining interior wall surface of the metal reservoir is a roughened etched surface by processing a roughing treatment, and
each of surfaces of the first and second ends through which the light passes is not the roughened etched surface.

21. An atomic cell comprising:
a body having a first end opposite to a second end, and an open interior space extending from the first end to the second end, the body being configured such that light travelling in a light passing direction enters the body from the first end, passes through the interior space of the body, and exits the body from the second end;
a wall provided in the body between the first and second ends, the wall configuring a periphery of the interior space;
a gaseous metal enclosed within the interior space; and
a liquid metal enclosed within the interior space,
wherein the wall is configured with a metal retaining interior wall surface on which the liquid metal is retained,
the metal retaining interior wall surface axially extends in the light passing direction, and
a contact angle of the liquid metal with respect to the metal retaining interior wall surface in the light passing direction is less than 90°, and
the liquid metal is spread out along the metal retaining interior wall surface.

* * * * *